United States Patent [19]
Wu

[11] Patent Number: 6,099,599
[45] Date of Patent: Aug. 8, 2000

[54] SEMICONDUCTOR DEVICE FABRICATION SYSTEM

[75] Inventor: Beuan P. F. Wu, Hsinchu, Taiwan

[73] Assignee: Industrial Technology Research Institute, Hsinchu, Taiwan

[21] Appl. No.: 09/190,339

[22] Filed: Nov. 12, 1998

Related U.S. Application Data

[63] Continuation-in-part of application No. 08/646,774, May 8, 1996, abandoned.

[51] Int. Cl.$^7$ .................................................... H01L 21/00
[52] U.S. Cl. .................................... 29/25.01; 204/298.25; 204/298.26; 204/298.35
[58] Field of Search ........................... 29/25.01; 438/908; 204/298.25, 298.26, 298.35; 118/719, 733, 50

[56] References Cited

U.S. PATENT DOCUMENTS

| | | |
|---|---|---|
| 5,344,365 | 9/1994 | Scott et al. . |
| 5,536,128 | 7/1996 | Shimoyashiro et al. . |
| 5,611,861 | 3/1997 | Higashi . |
| 5,795,356 | 8/1998 | Leveen . |

FOREIGN PATENT DOCUMENTS 3-241176  3/1991  Japan .

*Primary Examiner*—David E. Graybill
*Attorney, Agent, or Firm*—Merchant & Gould P.C.

[57] ABSTRACT

A semiconductor device fabrication system comprises a central hub area and multiple concentric ring sections circumferentially provided around the hub area. Each of the ring sections has a plurality of modular process units (MPUs) each receiving about three in-line semiconductor device processing stations therein and having the size of a standard shipping container for conveniently outgoing heavy repair. The MPUs are successively disposed around the hub area with the walls positioned radially of the hub area. Service facilities and handling piping system are provided under the MPUs. Each of the ring sections has a conveying track provided adjacent to the ring-shaped arranged MPUs for communication with the MPUs. A human maintenance system is provided in the system for carrying service persons to get into and out of the MPUs through the sidewalls thereof for light repair. The central hubs for common services or particular processes is communicated with the innermost ring section by providing multiple crossovers therebetween.

16 Claims, 4 Drawing Sheets

SEMICONDUCTOR DEVICE FABRICATION SYSTEM

This is a continuation-in-part application of application Ser. No. 08/646,774, filed May 8, 1996, abandoned.

FIELD OF INVENTION

The present invention relates to a microelectronic component fabrication system, particularly to a semiconductor device fabrication system with multiple ring-shaped layout.

PRIOR ART BACKGROUND

Currently, microelectronic components such as by way of examples only, semiconductor device, integrated circuits and flat panel displays are fabricated in a rectangular building-like facility which can typically be a 3-level structural building with outside dimensions of, for example, about 600 feet by 180 feet. The first or subfab floor generally contains the electric and mechanical equipment such as pumps and chemical/gas handling piping, the second or fab floor generally holds the clean room under ultra clean condition and the various processing stations which can accomplish processes such as lithography, etching, sputtering, chemical vapor deposition, diffusion, and the like, while the third floor handles air circulation/condition. Generally the facility is laid out with a longitudinal clean room which can run the length of the structure, up to 600 feet. Various work stations are located substantially perpendicularly to and along each side of the clean room. An automated material handling system is used to carry the wafers and substrates which are being processed up and down the clean room, and perpendicularly to the longitudinal direction of the clean room, to the equipment of the various processing steps. U.S. Pat. No. 5,611,861 issued to Shimoyashiro et al is directed to the conventional arrangement.

Such an arrangement is expensive to build and operate from a number of standpoints. First, the external shell of the building has to be designed so that the outer walls support the entire roof so that there are no interior posts to interfere with the positioning of the equipment in the fabrication process. Such an arrangement requires that the roof be supported by an expensive and complicated support system. Second, such a facility resides with the actual operation of the facility itself. In such an arrangement, the automated system for moving the wafers from station to station must travel up and down in the elongated clean room area to the stations such as stockers in order to reach the next available equipment for the required process. This will require the automation system to transport the wafers great distances.

Further, it is not convenient to expand such a typical fabrication facility. Generally, it would be simpler just to duplicate the complete fabrication facility in an adjacent area. Any modification to such facilities would require substantial changes, including the movement of walls, process equipment, gas and chemical circulation systems and the like. Further to retrofit, replace or upgrade existing equipment in such a facility would require that the facility be shut down and that equipment and structure be moved in order to access equipment that is to be retrofitted or replaced.

A futuristic design for a fully automated fabrication facility was proposed in a paper from Tohoku University, entitled *Circular Centered Single-Column Fab*. In this design, a circular dome-shaped building was proposed which is supported by an outer peripheral wall and a central tower. In this facility, the fabrication equipment is located outwardly of the central tower. Such equipment includes photolithography stations and the like. Such a configuration was never constructed and if it had been, it would have been extremely expensive due to the large dome-shaped roof required and the structure necessary to hold that roof in place. Further, safety would be an issue as special safety quarters would have to be constructed in order to allow for exit through the periphery of the structure. A further disadvantage is that the support services for such a plant such as gas plants, ultra pure water plants, chemical plants, and air-conditioning plants are located outside the circular area of the dome housing and thus increase the distance needed for distribution piping and conduit to serve the fabrication facility. Further, an expansion of such a facility would be difficult in that the outer walls, being required to support the roof, cannot be easily removed or modified.

An alternative design set forth in U.S. Pat. No. 5,344,365 issued to Scott et. al relates to a modification over a conventional semiconductor manufacturing facility by means of replacing a rectangular building with a circular, multi-story one and accommodating the work piece transportation system in its central silo. Since the flexibility in expanding and modifying the facilities is still limited under such configuration and the building's existence is indispensable, time and cost spent for constructing and maintaining this facility are not reduced. Furthermore, because the manufacturing area, work piece transportation system and facility supply system are all accommodated in a building, vibration produced, for example, from the transportation system when the work piece is conveyed will be readily transmitted to the manufacturing area and facility supply system.

Hence, it is desired to provide one or more semiconductor device fabrication systems that depart from the above limitations, reduce production cost, and enhance accessibility in facility construction and maintenance. This invention discloses a creative semiconductor device fabrication system for use in the field of microelectronic component fabrication process as follows.

SUMMARY OF INVENTION

It is an object of this invention to provide an improved layout for a semiconductor device fabrication system, in which multiple modular process units (MPUs) each having its own ultra clean environment facilities and standardized interface mechanism for quickly connecting to service/supply facilities (for the service including gases, chemicals, ultra pure water, vapor exhaust, liquid waste, air conditioning, centralized vacuum/clean compressed air, hot water, steam, natural gas, process cooling water, emergency power, conditioned/unconditioned power, and the like) are provided, thereby no tremendous building (shell) having clean internal space for housing the system is required and the MPUs can be easily removed from the fabrication system for maintenance.

It is another object of this invention to provide an improved layout for a semiconductor device fabrication system, in which the multiple clean modular process units (MPUs) (each having in-line work piece processing stations) are arranged in a concentric ring shape around a central hub area, together with corresponding conveying tracks adjacent thereto, thereby constructing an optimized layout for conveying work pieces in shortest distances without leaving the work pieces in the stocker (waiting station) for the guiding vehicle to pick them up to the next stations, and thus maximizing the capability of changing the conveying routing of the work pieces.

It is a further object of this invention to provide an improved layout for a semiconductor device fabrication system, in which the arrangement of the multiple clean modular process units (MPUs) allows for easy expansion of the factory without affecting ongoing operations by extending the MPU rings out radially from the central hub area and without major cost for reconstructing the building housing the fabrication facilities, and simplifies the automation of the work piece transfer so as to improve the utilization rate of the semiconductor fabrication tools provided on the semiconductor processing stations.

It is still an object of this invention to provide an improved layout for a semiconductor device fabrication system, in which the endless conveying tracks for rapid transportation of guiding vehicle carrying work pieces increases product handling speed and are independent of the foundation which supports the fabrication system, thereby the MPUs can be insulated from the vibration caused by the high speed transportation.

It is still an object of this invention to provide an improved layout for a semiconductor device fabrication system, in which accesses are provided on the sidewalls of the MPU in order to allow human repair and replacement of the processing equipment from the hub buildings without interfering with the operation of the entire system, and in which a ring-shaped platform is provided externally of the ring-shaped system for supporting the MPUs which are lifted out of the system by using standard shipping container handling type of mechanism for outgoing heavy repair and replacement.

It is an object of this invention to provide an improved layout for a semiconductor device fabrication system, in which the MPU itself can serve as a unit accommodating service/supply facilities to provide, for example a small quantity of supplies (such as photoresist and low consumption chemicals) for the neighboring MPU so as to reduce loss of chemicals which are presumed to be transported along pipes in the conventional system.

It is an object of this invention to provide an improved layout for a semiconductor device fabrication system, in which the MPUs independently of each other result in avoidance of a hazardous MPU (such as outbreak of a fire in an MPU or health hazardous exposure existing in an MPU) from another, thereby reducing the potential problems of mutual contamination among the MPUs as well as ensuring the safety of any operation personnel presented in any MPU.

The structure and advantages of this invention may be clearly understood by persons skilled in the art with reference to the following illustrations and descriptions as well as the accompanying drawings of preferred embodiments.

BRIEF DESCRIPTIONS OF DRAWINGS

DETAILED EXPLANATIONS OF PREFERRED EMBODIMENTS

The present invention is provided basing on a concept improving the layout of fabrication system for microelectronic components, particularly semiconductor devices, in which the improved layout results in lower initial and ongoing cost, provides for easy expansion without interrupting ongoing operations, improves utilization of semiconductor fabrication tools, enhance production capacity, provides for simpler automation of work piece transfer (such as silicon wafer, substrate or glass plates), reduces system vibration in operation, shortens service (such as chemicals) supplying distances, eliminates waiting time from station to station during work piece transportation, provides for easy and low cost maintenance, avoids sudden spreads of hazards, and reduces mutual contamination due to health hazardous exposure. Two typical embodiments of the system according to the present invention are illustrated in the following descriptions and drawings, in which a first embodiment generally denoted as 1 is depicted in FIGS. 1–3 and a second embodiment generally denoted as 100 is depicted in FIGS. 5–8.

Figure 1:
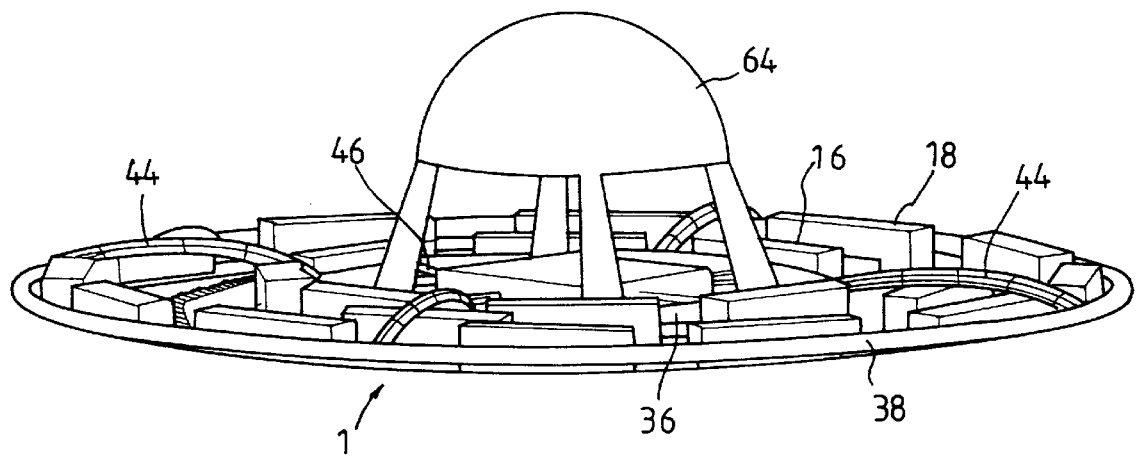
FIG. 1 is a schematic perspective view of a first embodiment of a semiconductor device fabrication system according to the claimed invention.
Figure 2:
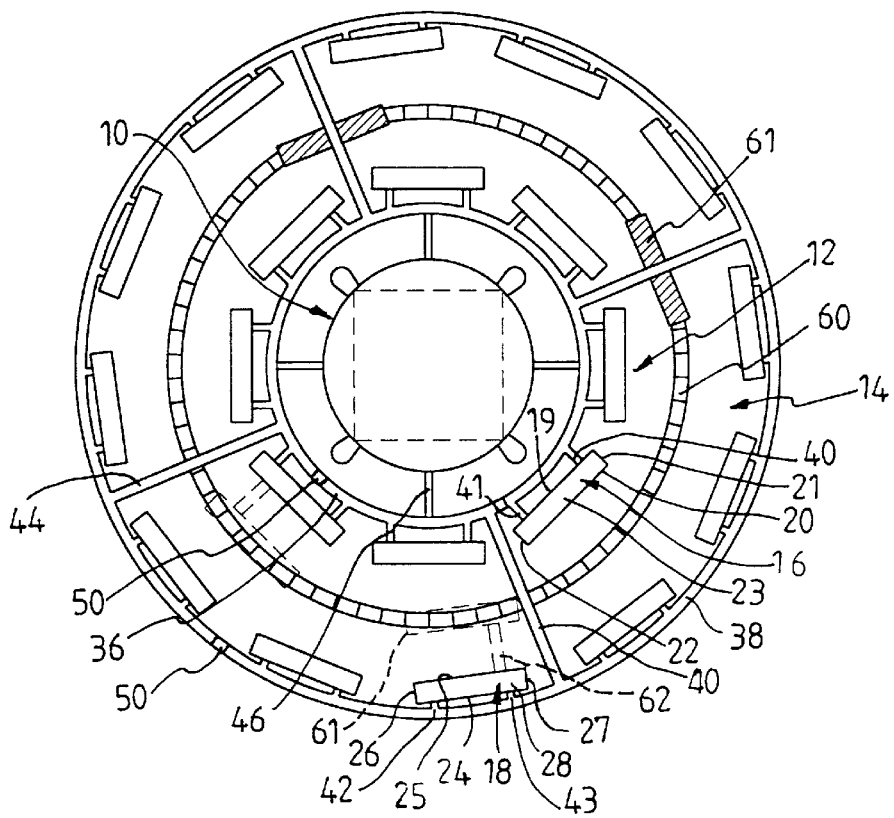
FIG. 2 is a schematic plan view of FIG. 1 showing the layout thereof.

Referring to FIGS. 1 and 2, the semiconductor device fabrication system 1 comprises a central hub area 10, two ring sections which are a first ring section 12 and second ring section 14 circumferentially and concentrically provided around the hub area 10, in which the second ring section 14 is externally of the first ring section 12. The central hub area 10 can be configured in the shape of a circle, triangle, square, rectangular, pentagon, hexagon, heptagon, octagon or any other uniform or non-uniform closed or open shape to serve as the core of the claimed system 1.

The first ring section 12 and the second ring section 14 include a plurality of modular process units (MPUs) 16 and 18, respectively. The MPU 16 has two opposite sidewalls 19, 20 and two opposite endwalls 21, 22 which define an internal space 23. The MPU 18 has two opposite sidewalls 24, 25 and two opposite endwalls 26, 27 which define an internal space 28. The MPUs 16 and 18 are successively disposed around the hub area 10 with the sidewalls 19, 20, 24, 25 positioned radially of the hub area 10.

Figure 3:
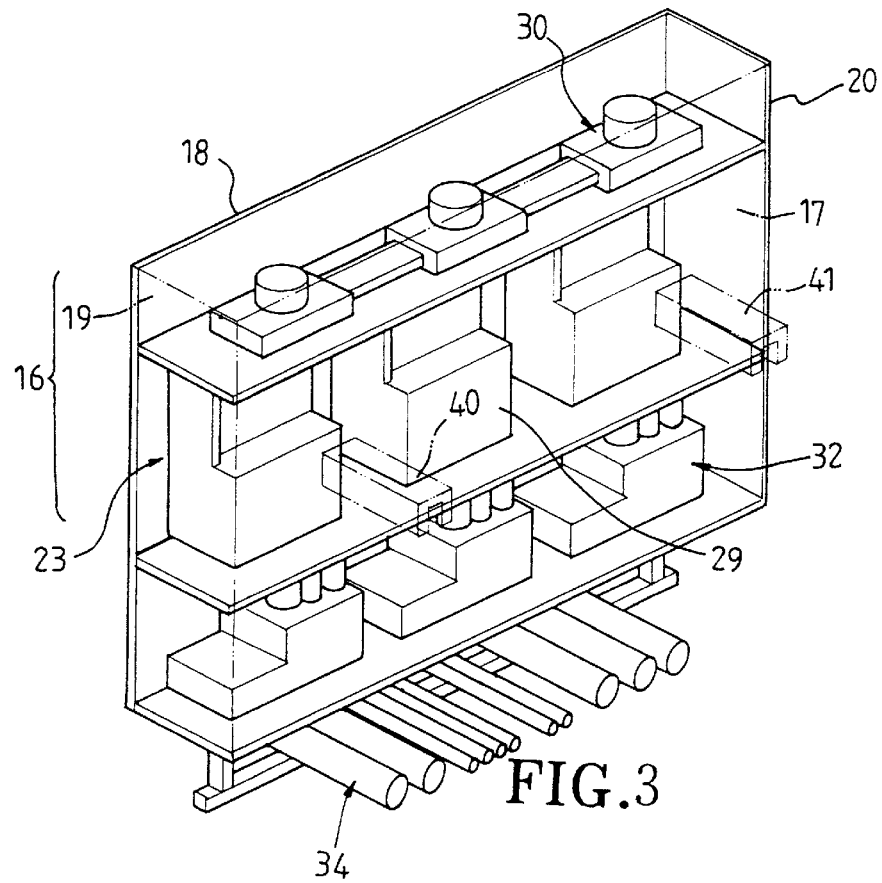
FIG. 3 is a schematic perspective view of FIG. 1 showing a modular process unit (MPU) supported by service facilities and a facility handling piping system (or group)

One exemplified embodiment of the MPU 16 (which can be adopted for the MPU 18) is depicted in FIG. 3. The MPU 16 houses three in-line semiconductor device processing stations 29 in the first story of its internal space 23 and an air conditioning system 30 in the second story of the same space 23. These stations 29 are employed in the fabrication of microeletronic circuitry which includes the operations of chemical vapor deposition, etching, lithography, spattering, ion implantation, and diffusion, among others. It follows that one or more of the MPUs 16, 18 can be identified as gas processing units, one or more of the MPUs 16, 18 can be identified as liquid chemical processing units, one or more of the MPUs 16, 18 can be identified as ultra pure water processing units, and one or more of the MPUs 16, 18 can be known as other processing units that do not require gas, chemicals or ultra pure water service, and are also segregated. To be adapted for the illustration of this embodiment, these semiconductor device processing stations 29 are in-line arranged in a direction substantially perpendicular to a radial direction of the ring sections 12, 14. The air conditioning system 30 at the upper story provides the stations 29 at the lower story with air circulation under an ultra clean environment.

There are a plurality of service or supply facilities 32 correspondingly detachably provided under the MPUs 16, 18 and there is a handling piping system 34 provided under the service facilities 32. The supply facilities 32 provide the services such as electricity, electro-mechanical pumps, radio-frequency generators, etc. The process cooling water, chillers, natural gas, central vacuum, compressed and dry air, hot water, steam and exhaust are provided by the habdling piping system 34. The handling piping system 34 can be distributed to penetrate into the upper fabrication stories, i.e. the internal spaces 23 of the MPUs 16, to connect to the semiconductor fabrication tools in the processing stations 29.

The two ring sections 12, 14 further comprises two conveying tracks correspondingly adjacent to the MPUs 16, 18, in which a first conveying track 36 is internally adjacent to the MPUs 16 of the first ring section 12 and a second conveying track 38 is externally adjacent to the MPUs 18 of the second ring section 14. Each of the MPUs 16, 18 has two through doors (not shown) formed at the sidewall 19, 24. There are two passages 40, 41 provided for connection between the MPU 16 and the conveying track 36, in which the passage 40 can be, for example, identified as an incoming passage 40 and the other can be identified as an outgoing passage 41 and vice versa. Similarly, there are two passages 42, 43 provided for connection between the MPU 18 and the conveying track 38, in which the passage 42 can be, for example, identified as an incoming passage 42 and the other can be identified as an outgoing passage 43, and vice versa. In order to make connections between the first ring section 12 and the outer second ring section 14, a plurality of first crossovers 44 are provided to connect between the first conveying track 36 and second conveying track 38. Each of the first crossovers 44 preferably extends from the first conveying track 36 at the space between which the two adjacent MPUs 16 are located, to the second conveying track 38 at the space between which the two adjacent MPUs 18 are located such that the first crossover 44 can be set up in the shortest length. In order to make connections between the first ring section 12, which may be a communicating medium of the second ring section 14, and the hub area 10, a plurality of second crossovers 46 are provided to connect between the first conveying track 36 and the central hub area 10 so as to convey the work piece to the central hub area 10 for the services processed by the apparatus such as photolithography stepper, X-ray lithographic machine, and/or related developing machines.

In the dynamic operation of this embodiment, the claimed system 1 should include an automation system under computerization which needs only search for the first available semiconductor fabrication tool in the processing station 29 within the MPU 16, 18 to perform every successive required processing step. The automation system (not shown) comprises and controls at least one shuttle bus 50 which travels along full or local region of the first conveying track 36 and/or the second conveying track 38 to carry the work pieces (glass plate, substrate, silicon wafer, etc.) to the incoming passage 40 for a processing step in an MPU and pick up those from the outgoing passage 41 thereof so as to perform the next processing step in the next MPU.

Figure 4:
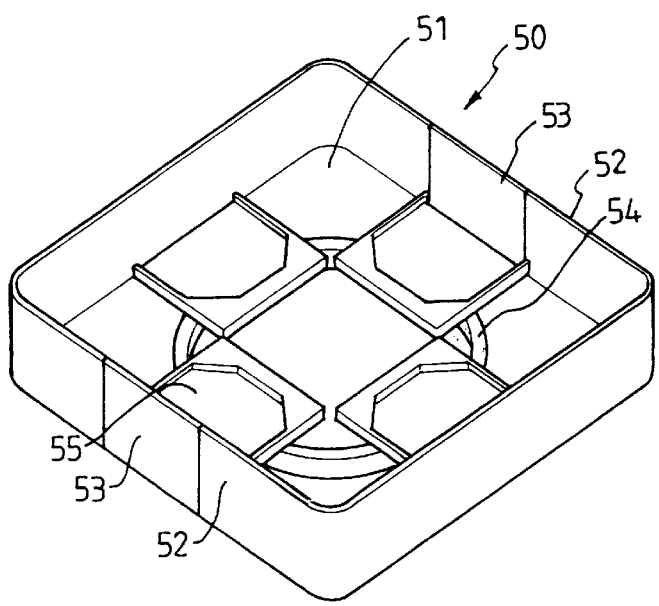
FIG. 4 is a schematic view showing a guiding vehicle carrying work pieces for transportation among the MPUs.
Figure 5:
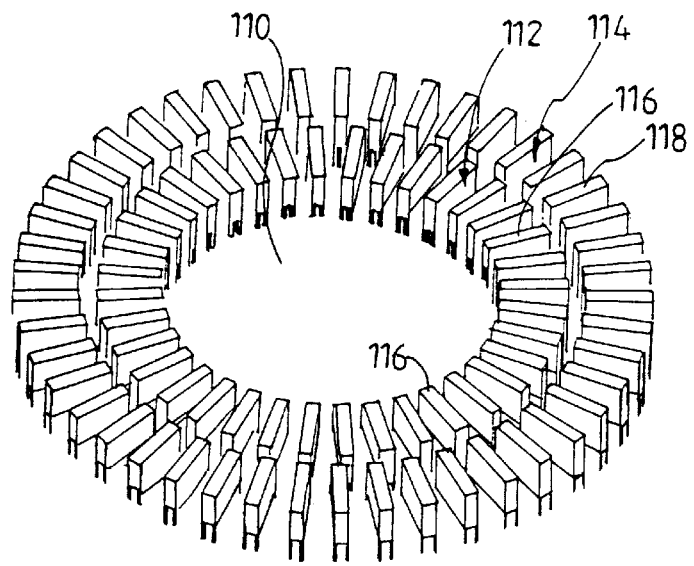
FIG. 5 is a schematic perspective view of a second embodiment of a semiconductor device fabrication system with only the arrangement of MPUs depicted therein.
Figure 6:
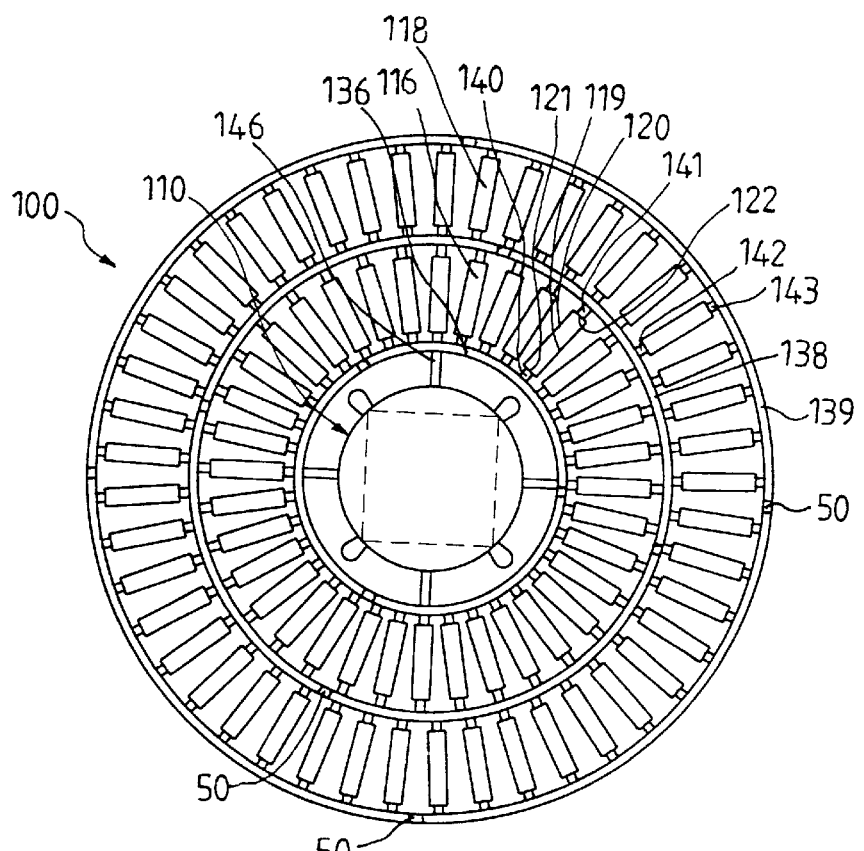
FIG. 6 is a schematic plan view of FIG. 5 showing the layout of the second embodiment thereof.

Referring to FIG. 4, the shuttle bus 50 is configured as a rectangular parallelepiped which includes four sidewalls defining an environmental controlled chamber 51, in which two of the sidewalls 52 opposite to each other are provided with two opposite "dust-free type" doors 53 centrally formed thereon. The bus 50 further centrally provides in the chamber 51 a revolving disk 54 which supports four trays 55 for receiving the conveyed work pieces, in which the trays 55 are circumferentially disposed on the disk 54 and equally spaced apart from each other. When one of a work piece is required to be sent out of the shuttle bus 50 and into the designated MPU through the incoming passage 40, the disk 54 rotates to a position that the tray 55 receiving the work piece is in alignment with the dust-free door 53. In the meantime, the dust-free door 53 of the bus 50 which has been conveyed in front of the through door, by way of example only, at the sidewall 19 of the MPU 16 magnetically adheres to the through door at the sidewall 19 of the MPU 16 to be opened together to assure dust free condition, then the door 53 and through door adhered to each other are closed and separated afterwards after the transportation of the target work piece is accomplished, and finally the shuttle bus 50 leaves for the next stop, thereby ensuring the transportation of the work piece be in an ultra clean environment.

Further referring to FIGS. 1 and 2, if the next stations to be processed are located in the MPU of the other ring section and in the central hub area 10, the shuttle bus 50 carrying the target work piece can pass through the first crossovers 44 and the second crossovers 46, respectively. For example, the shuttle bus 50 can pick up the target work piece delivered from the outgoing passage 41 of the MPU 16 through the first crossover 44, finally to the incoming passage 42 of the MPU 18 for next required processing step.

For human access to the MPUs 16, 18 for light repair or replacement of the semiconductor fabrication tools, the fabrication system 1 of this embodiment further comprises a maintenance track 60 which is concentrically provided between the first ring section 12 and the second ring section 14. The maintenance track 60 is located exactly adjacent to the MPUs 16 of the first ring section 12 and the MPUs 18 of the second ring section 14, in which the location is opposite to those of the first conveying track 36 and second conveying track 38 with respect to the MPUs 16, 18, respectively. The maintenance track 60 has at least one container 61 running thereon by means of a computerized control. In case of human maintenance for the semiconductor fabrication tools in the MPUs, the container 61 carrying service persons running along the track 60 stops at the back of the target MPU to be served, for example the MPU 18 of the second ring section 14. A corridor 62 extends from the container 61 to the back of the MPU 18 to construct a passage for the persons to get into the internal space 28 of the MPU 18 for repair and maintenance. To keep the persons getting into the MPU clean, a concept similar to the dust free work piece transportation as described above can be adopted here by providing an ultra-clean car which houses the service persons to enter into the target MPU by means of dual magnetic adhered door mechanism.

As for human habitation in watching and control the operation of the whole system 1, as shown in FIG. 1, a hub building 64 can be disposed over the central hub area 10.

Figure 7:
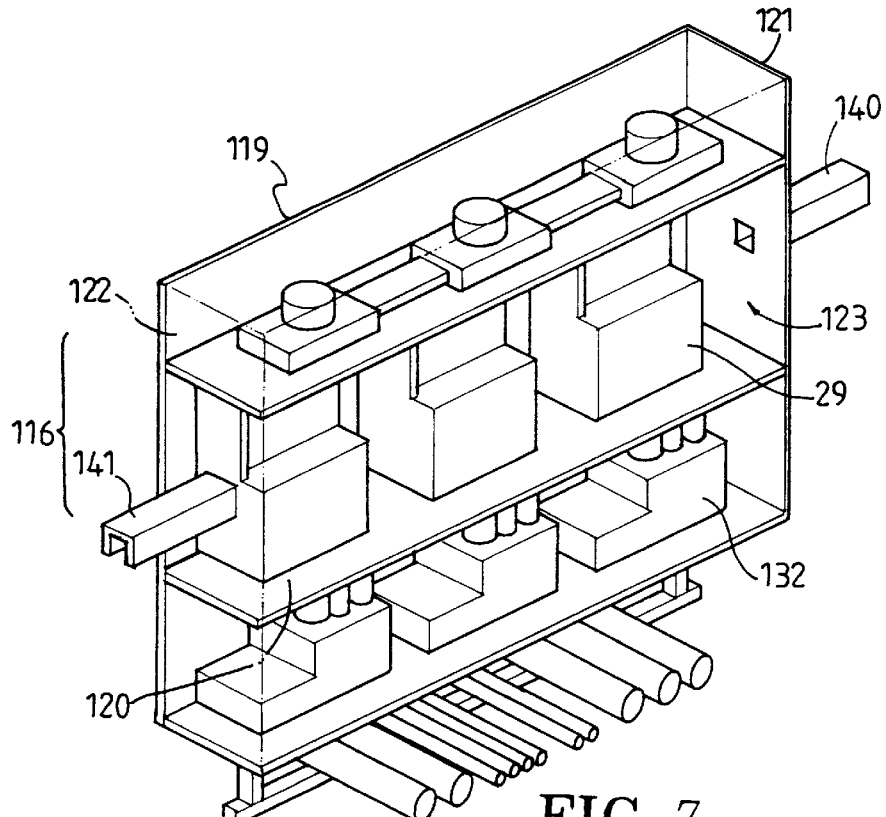
FIG. 7 is a schematic perspective view of FIG. 5 showing a modular process unit (MPU) of FIG. 5 which is supported by service facilities and a handling piping.

Now turning to an alternative embodiment as depicted in FIGS. 5–8, which illustrate, by way of example only, two ring sections 112, 114 constructing the claimed system 100. This embodiment utilizes a similar concept to the first embodiment as described but different configuration in the MPUs' arrangement (see FIG. 5 for an example having two concentric ring sections 112, 114). The differences reside in that according to this second embodiment, the MPUs 116 (also 118) are successively disposed around the hub area 110 with the endwalls 121, 122 positioned radially of the hub area 110. As depicted in FIG. 7, the incoming passage 140 (also 142) and the outgoing passage 141 (also 143) is now disposed at the sidewalls 121, 122 of the MPU for the transportation routing in this embodiment as described below, and the semiconductor processing stations 29 are in-line arranged in a radial direction of the ring sections 112, 114.

Furthermore, in such an arrangement which disposes the longitudinal direction of the MPUs 116, 118 to be parallel with the radial direction of the ring section 112, 114, the system 100 should comprise three conveying tracks to undertake a perfect work piece transportation task, in which the first conveying track 136 is provided internally adjacent to the MPUs 116 of the first ring section 112, the second conveying track 138 is provided externally adjacent to the MPUs 116 of the first ring section 112 and internally adjacent to the MPUs 118 of the second ring section 114, the third conveying track 139 is provided externally adjacent to the MPUs 118 of the second ring section 116. The second conveying track 138 plays the role of making a communication between the MPUs 116 of the first ring section 112 and the MPUs 118 of the second ring section 114, while the first conveying track 136 and the third conveying track 139 are responsible for delivering the work pieces from an MPU 116 and 118 to another in the same ring sections 112 and 114, respectively. The shuttle bus (which has similar construction to the bus 50 of the first embodiment) moving on the first conveying track 136 sends the target work piece to the MPU 116 through the incoming passage 140, then the bus 50 moving on the second conveying track 138 picks up the target work piece delivered from the outgoing passage 141 of the MPU 116 and sends it to the next designated MPU 118, by way of example only, through the incoming passage 142, and finally the bus 50 on the third conveying track 139 picks up the target work piece from the outgoing passage 143 for next required processing step. It follows that according to the design of work piece transportation routing, any possible transmission among the MPUs 116, 118 can easily be accomplished and no crossover in connection with the MPUs 116 and 118 is required in this embodiment. There certainly can be a plurality of buses like the bus 50 on a single track 136, 138 or 139 to reduce the workload of each bus.

In order to make connections between the first ring section 112, which is a communicating medium of the second ring section 114 as described, and the hub area 10, a plurality of crossovers 146 are provided to connect between the first conveying track 136 and the central hub area 110 so as to convey the work piece to the central hub area 110 for the services processed by common or particular apparatus.

The system 100 of this embodiment is monitored and serviced by persons in the hub buildings 164 which are disposed over the hub area 110 and/or the ring sections 112, 114. When any of the MPUs 116, 118 is required to be cared for by human service, the persons in the hub buildings 164 can have access to the interior space 123 through the sidewall 119 or the sidewall 120 by means of a maintenance system which comprises a transverse and vertical human transportation system including at least one container such as cable cars or elevator cars (not shown). Accordingly, no additional conveying track for human service is required in this embodiment.

Figure 8:
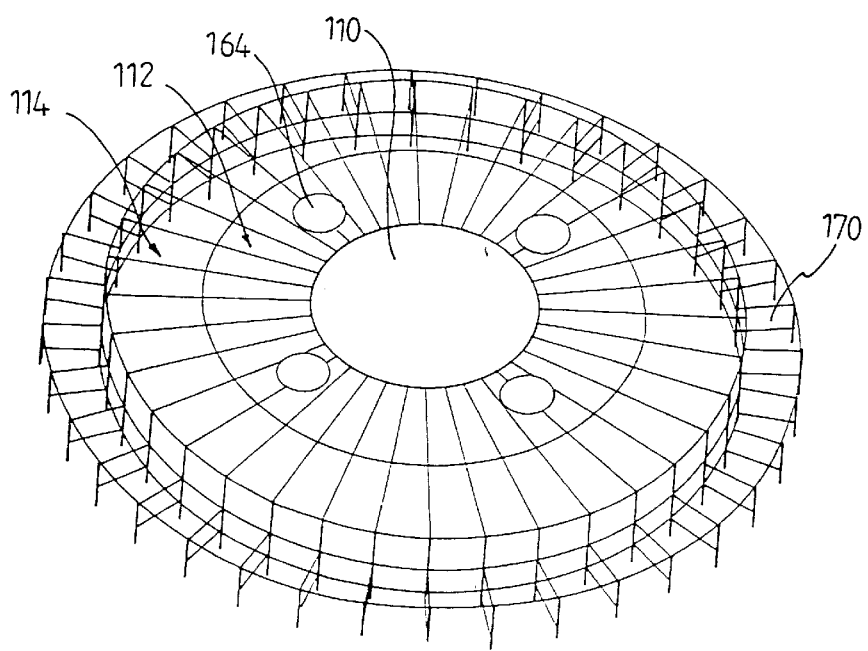
FIG. 8 is a schematic perspective view showing a ring-shaped platform externally of the ring sections illustrated in FIG. 5.

In case that serious problems occur in the semiconductor fabrication tools which are intended for outgoing heavy repair and replacement, the MPU containing the troubling tools can be lifted out of the ring section onto the ring-shaped platform 170 which is externally provided around the outermost ring section as shown in FIG. 8. The movement of the MPU can be accomplished by using standard shipping container handling mechanism or the like (not shown) and the platform 170 is preferably constituted to a level substantially equivalent to that of a standard shipping container sized trailer so as to be ready for being towed by a trailer truck.

Aforementioned explanations are directed to the descriptions of preferred embodiments according to the present invention. Various changes and implementation, by way of example only, including the modification of the human maintenance system (i.e. the maintenance track 60 system) of the first embodiment as depicted in FIG. 2 by adopting the maintenance system of the second embodiment, the additional arrangement of a ring-shaped platform in FIG. 8 onto the first embodiment so as to attain equivalent effects, the formation of gateways on the sidewalls of the service or supply facilities 132 for human emergency and maintenance use, can be made by those skilled in the art without departing from the technical concept of the present invention.

Descriptions for Functionality and Effectiveness Performed by the Aforementioned Embodiments Expansion of the semiconductor fabrication system 1, 100 can be easily accomplished by extending the ring sections comprising MPUs therein radially outwardly from the central hub area without interfering with the operation of the whole system. Conduit/piping can be easily extended to service the extended MPUs. Further, through the gateways formed at the sidewalls of each MPU, processing stations can be installed, repaired, and removed easily by the use of heavy equipment brought inbetween adjacent MPUs. Another example of expansion is to construct over capacity ring shaped sections as well as an appropriate platform outward with necessary supply facilities but only establish partial MPUs as desired initially in the ring-shaped sections. When expansion of more MPUs is required, they can be easily and quickly moved into the initial construction, thereby saving cost in the initiation of the factory and retaining flexibility for expansion. Also, as described below, unlike the prior art, each MPU can have a length of about 40 feet compared to 180 feet of a conventional facility. Thus, the roof support system of the present invention can be simpler and less costly to construct.

Under the Uniform Building Code, a microelectronic component fabrication facility is classified as an H6 occupancy. This occupancy classification requires stringent emergency exiting standards including the separation of emergency exit corridor from chemical distribution routes. The H6 occupancy classification requires emergency exits to be closely spaced. All of these requirements place serious restrictions on the layout of microelectronic component fabrication facilities, such as the claimed semiconductor device fabrication system. The current state-of-the-art facility which the typical clean bay and service chase or ballroom laid out in a large rectangular building will have as much as 10% of the building's space used up by an emergency corridor system. The improved hub area and ring-shaped arranged MPU layout of this invention overcomes this deficiency as emergency exits and gateways are located as mandated under the building code at the sidewalls of each MPU, without requiring a special emergency corridor system. The emergency gateways are designed to allow the service persons readily to get into the MPU to be serviced kept apart from the hazardous MPU.

Current state-of-the-art microelectronic component fabrication facilities require wide corridors to move the semiconductor fabrication tools into position within the clean processing area. The improved central hub area and concentric ring-shaped arranged MPUs of the invention allow semiconductor fabrication tools to be rigged and lifted from the outside yard directly into position within the MPU. The installation is performed using a mobile crane and by simply removing a demountable section of the sidewalls, and positioning the fabrication tools (i.e. processing stations) in the correct spot. Removing and changing a tool is accomplished in the same fashion and is significantly simpler than removing a fabrication tool from the current state-of-the-art fabs where tremendous clean room walls often have to be removed to accomplish the removal and change out of semiconductor fabrication tools.

The central hub and ring-shaped arranged MPU layout is perfectly suited to house a standard Manufacturing Interface (SMIF) or other minienvironment system. These systems are becoming more popular as a method to simplify the overall cleanliness requirements for the MPUs of a semiconductor device fabrication system. The ease in accommodating such minienvironments is due to the fact that the clean internal space (i.e. so-called "clean bay") within an MPU can be designed with an appropriate cleanliness specification to house the SMIF or other minienvironment system. The clean internal space will always remain in a fixed spatial relationship with respect to the overall spatial configuration even after the fabrication system is expanded by radiating number of the ring sections further outward. This allows the clean bay to be designed to simply accommodate the SMIF or other minienvironment system. In the current state-of-the-art fabrication facilities, SMIF is expensive to retrofit after a clean internal space and service chase layout is initially chosen.

Conventional fabrication facilities are about 600 feet long and about 150 to 180 feet wide. It is desirable that the roof for such a facility be entirely supported by the outer walls as any post or pillars internal to the outer walls can restrict the placement of the equipment, further hindering fabrication process and maintenance of the facility. In order to avoid internal pillars and columns, the conventional roof and truss system, which is very expensive and heavy, is supported by the outer walls. In the present invention, as each MPU in a preferred embodiment has a standard shipping container size length of 40 feet, such a complicated and elaborated roof supporting trussing system is not required and thus there is substantial savings in fabrication of the plant.

Given the above, the present semiconductor device fabrication system provides a cost effective, flexible, and readily expandable processing plant. Other features, aspects and objects of the invention can be obtained from a review of the claims as well as the figures. Other embodiments of the invention can be conceived and fall within the spirit and scope of the invention defined in the claims.

What is claimed is:

1. A semiconductor device fabrication system, comprising:
   a central hub area;
   at least one ring section circumferentially provided around the hub area, the ring section including:
      a plurality of modular process units, each having two opposite sidewalls and two opposite endwalls which define an internal space, the modular process units being successively disposed around the hub area with the sidewalls positioned radially of the hub area, the modular process unit including:
         at least one semiconductor device processing station disposed in the internal space;
         an air conditioning system provided at a top of the internal space;
         at least two through doors formed at one of the sidewalls of the unit;
      a plurality of service facilities correspondingly provided under the modular process units;
      a handling piping system provided under the service facilities;
      a conveying track correspondingly provided adjacent to the modular process units;
      passages provided for connection between the modular process units and the conveying track through the through doors; and
   at least one maintenance track which is provided adjacent to the modular process units and opposite to the conveying track, the maintenance track having at least one container thereon which is accessible to the internal space of each of the modular process units.

2. The semiconductor device fabrication system as set forth in claim 1, including two ring sections which are a first ring section and a second ring section, wherein the first ring section and the second ring section concentrically provided around the hub area, and the second ring section is provided externally of the first ring section.

3. The semiconductor device fabrication system as set forth in claim 2, wherein the conveying track of the first ring section is a first conveying track which is internally adjacent to the modular process units of the first ring section, and wherein the conveying track of the second ring section is a second conveying track which is externally adjacent to the modular process units of the second rings.

4. The semiconductor device fabrication system as set forth in claim 3, including a maintenance track which has a plurality of containers and which is concentrically provided between the first ring section and the second ring section.

5. The semiconductor device fabrication system as set forth in claim 3, further comprising a plurality of first crossovers connected between the first conveying track and second conveying track.

6. The semiconductor device fabrication system as set forth in claim 1, further comprising a plurality of second crossovers which are provided between the conveying track and the central hub area.

7. The semiconductor device fabrication system as set forth in claim 4, further comprising a plurality of corridors which is provided on each of the containers for communication with the internal space of each of the modular process units.

8. The semiconductor device fabrication system as set forth in claim 7, wherein each of the modular process units includes a plurality of semiconductor device processing stations which are in-line arranged in a direction substantially perpendicular to a radial direction of the ring sections.

9. The semiconductor device fabrication system as set forth in claim 1, further comprising at least one hub building which is disposed over the central hub area and is capable of human habitation.

10. A semiconductor device fabrication system, comprising:
   a central hub area;
   at least one ring section circumferentially provided around the hub area, the ring section including:
      a plurality of modular process units, each having two opposite sidewalls and two opposite endwalls which define an internal space, the modular process units being successively disposed around the hub area with the endwalls positioned radially of the hub area, the modular process unit including:

- at least one semiconductor device processing station disposed in the internal space;
- an air conditioning system provided at a top of the internal space;
- two through doors formed at the opposite endwalls of the unit, respectively;
- a plurality of service facilities correspondingly provided under the modular process units;
- a handling piping system provided under the service facilities;

at least two conveying tracks provided adjacent to the endwalls of the modular process units;

passages provided for connection between the modular process units and the conveying track through the through doors; and a maintenance system which is provided over the modular process units, the maintenance system having at least one container which is accessible to the internal space of each of the modular process units.

11. The semiconductor device fabrication system as set forth in claim 10, including two ring sections which are a first ring section and a second ring section concentrically provided around the hub area, wherein the second ring section is provided externally of the first ring section.

12. The semiconductor device fabrication system as set forth in claim 11, including three conveying tracks which are a first, a second and a third conveying track, wherein the first conveying track is internally adjacent to the modular process units of the first ring section, the second conveying track is externally adjacent to the modular process units of the first ring section and internally adjacent to the modular process units of the second ring section, the third conveying track is externally adjacent to the modular process units of the second ring section.

13. The semiconductor device fabrication system as set forth in claim 12, further comprising a plurality of crossovers which are provided between the first conveying track and the central hub area.

14. The semiconductor device fabrication system as set forth in claim 10, wherein each of the modular process units includes a plurality of semiconductor device processing stations which are in-line arranged in a radial direction of the ring sections.

15. The semiconductor device fabrication system as set forth in claim 10, further comprising at least one hub building which is disposed over the ring section and is capable of human habitation.

16. The semiconductor device fabrication system as set forth in claim 10, further comprising a ring-shaped platform which is externally provided around the ring section.

* * * * *